United States Patent
Edelberg et al.

(10) Patent No.: US 7,083,903 B2
(45) Date of Patent: Aug. 1, 2006

(54) METHODS OF ETCHING PHOTORESIST ON SUBSTRATES

(75) Inventors: Erik A. Edelberg, Castro Valley, CA (US); Robert P. Chebi, Foster City, CA (US); Gladys Sowan Lo, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 120 days.

(21) Appl. No.: 10/462,830

(22) Filed: Jun. 17, 2003

(65) Prior Publication Data

US 2004/0256357 A1 Dec. 23, 2004

(51) Int. Cl.
*G03F 7/00* (2006.01)
*G03F 7/36* (2006.01)

(52) U.S. Cl. .............. 430/329; 430/313; 430/315; 430/317; 216/62; 216/67; 438/725

(58) Field of Classification Search .............. 430/329, 430/313, 315, 317; 216/62, 67; 438/725
See application file for complete search history.

(56) References Cited

U.S. PATENT DOCUMENTS

| | | | |
|---|---|---|---|
| 4,861,424 A | 8/1989 | Fujimura et al. | 216/67 |
| 5,145,764 A | 9/1992 | Bauer et al. | 430/260 |
| 5,338,399 A | 8/1994 | Yanagida | 438/723 |
| 5,366,590 A | 11/1994 | Kadomura | 216/67 |
| 5,786,276 A | 7/1998 | Brooks et al. | 438/724 |
| 5,821,036 A | 10/1998 | Ficner et al. | 430/326 |
| 5,824,604 A | 10/1998 | Bar-Gadda | 438/725 |
| 5,872,061 A | 2/1999 | Lee et al. | 438/705 |
| 6,024,887 A * | 2/2000 | Kuo et al. | 216/48 |
| 6,051,504 A | 4/2000 | Armacost et al. | 438/706 |
| 6,174,451 B1 * | 1/2001 | Hung et al. | 216/67 |
| 6,362,109 B1 | 3/2002 | Kim et al. | 438/706 |
| 6,380,096 B1 | 4/2002 | Hung et al. | 438/723 |
| 6,391,146 B1 * | 5/2002 | Bhatnagar et al. | 118/715 |
| 6,440,864 B1 * | 8/2002 | Kropewnicki et al. | 438/710 |
| 6,451,703 B1 | 9/2002 | Liu et al. | 438/710 |
| 2002/0111036 A1 | 8/2002 | Zhu et al. | 438/754 |
| 2004/0214448 A1 * | 10/2004 | Chan et al. | 438/725 |

FOREIGN PATENT DOCUMENTS

EP    0 908 940 A2    4/1999

OTHER PUBLICATIONS

Pavel, E., "Combining Microwave Downstream and RF Plasma Technology for Etch and Clean Applications", Proceedings of the Electrochemical Society, Oct. 17-22, 1999.
Lee, W., "A New Approach in Photoresist Stripping and Post Plasma Etch/Ash Wafer Cleaning for Sub Micron Processes", EKC Technology, Inc. Hayward, CA, pp. 326-341.

(Continued)

*Primary Examiner*—Nicole Barreca
(74) *Attorney, Agent, or Firm*—Buchanan Ingersoll PC

(57) ABSTRACT

Methods of etching a carbon-rich layer on organic photoresist overlying an inorganic layer can utilize a process gas including $C_xH_yF_z$, where $y \geq x$ and $z \geq 0$, and one or more optional components to generate a plasma effective to etch the carbon-rich layer with low removal of the inorganic layer. The carbon-rich layer can be removed in the same processing chamber, or alternatively can be removed in a different processing chamber, as used to remove the bulk photoresist.

35 Claims, 6 Drawing Sheets

OTHER PUBLICATIONS

Kirkpatrick, A. et al., "Eliminating Heavily Implanted Resist in Sub-0.25-μm Devices", Micromagazine, 14 pages.

Notification of Transmittal of the International Search Report and the Written Opinion of the International Searching Authority, or the Declaration dated Apr. 21, 2005 for PCT/US04/19054.

Notification Concerning Transmittal of Copy of International Preliminary Report on Patentability Chapter 1 of the Patent Cooperation Treaty issued Dec. 19, 2005 in PCT/USUS2004/019054 and Written Opinion issued Apr. 21, 2005.

* cited by examiner

METHODS OF ETCHING PHOTORESIST ON SUBSTRATES

BACKGROUND

Plasma processing apparatuses are used for processes including plasma etching, physical vapor deposition, chemical vapor deposition (CVD), ion implantation, and resist removal.

Photoresist materials are used in plasma processing operations to pattern materials. Commercial photoresists are blends of polymeric and other organic and inorganic materials. A photoresist is applied onto a substrate, and radiation is passed through a patterned mask to transfer the pattern into the resist layer. The two broad classifications of photoresist are negative-working resist and positive-working resist, which produce negative and positive images, respectively. After being developed, a pattern exists in the photoresist. The patterned photoresist can be used to define features in substrates by etching, as well as to deposit materials onto, or implant materials into, substrates.

SUMMARY OF THE INVENTION

Methods for etching organic photoresist on substrates are provided. The methods can selectively etch photoresist relative to the substrate.

A preferred embodiment of the methods of etching organic photoresist on a substrate comprises positioning in a plasma processing chamber a substrate including an inorganic layer and an organic photoresist overlying the inorganic layer, the photoresist including a carbon-rich layer overlying bulk photoresist; supplying to the processing chamber a process gas comprising $C_xH_yF_z$ (where $y \geq x$ and $z \geq 0$), and at least one of (i) an oxygen-containing gas, and (ii) a hydrogen-containing gas different from $C_xH_yF_z$; generating a plasma from the process gas; and selectively etching the carbon-rich layer relative to the inorganic layer.

The bulk photoresist can be etched in the same plasma processing chamber that is used to etch the carbon-rich layer. Alternatively, the bulk photoresist can be etched in an ashing chamber. The bulk photoresist preferably is etched using a different chemistry than used to remove the carbon-rich layer.

Another preferred embodiment of the methods of etching organic photoresist on a substrate comprises supplying to a plasma processing chamber a process gas comprising $CH_3F$ and at least one of (i) an oxygen-containing gas, and (ii) a hydrogen-containing gas different from $CH_3F$; generating a plasma from the process gas; and selectively etching a carbon-rich layer on the substrate relative to an inorganic layer on the substrate while applying an external RF bias to the substrate.

DETAILED DESCRIPTION

Figure 1:
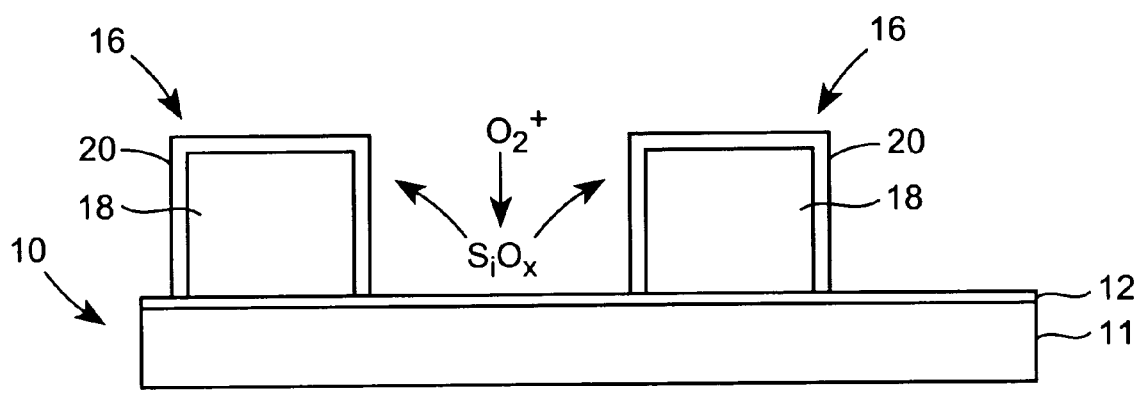
FIG. 1 schematically illustrates a process for removing an ion-implanted, carbon-rich layer formed on photoresist overlying a silicon substrate using a plasma generated from 100% $O_2$ or $H_2O$ vapor with RF bias applied to the substrate.

In integrated circuit (IC) manufacturing processes that utilize ion implantation, shrinking device geometries, increased ion implantation energies and doses, and new materials make it increasingly difficult to produce residue-free devices. Residues remaining from etching and ashing processes can produce undesirable electrical effects and corrosion that reduce product yields. See E. Pavel, "Combining Microwave Downstream and RF Plasma Technology for Etch and Clean Applications," 196th Meeting of the Electrochemical Society, (October, 1999).

In plasma processing techniques, such as plasma etching and reactive ion etching (RIE), and in ion implantation, photoresist is applied onto a substrate to protect selected regions of the substrate from being exposed to ions and free radicals. Organic polymer compositions have been formulated for such resist applications.

Photoresists are removed, or "stripped," from the underlying substrate after the substrate has been processed by etching, ion implantation, or the like. It is desirable that the photoresist stripping process leave the substrate surface as clean as possible, desirably without any residual polymer film or resist material. Wet and dry stripping techniques can be used to remove photoresist. Wet stripping techniques use solutions containing organic solvents or acids. Dry stripping (or "ashing") techniques use an oxygen plasma for photoresist removal.

Ion implantation fabrication techniques are used to dope regions of a substrate with impurities to change the electrical properties of the substrate. Ion implantation can be used as a source of doping atoms, or to introduce regions of different composition in a substrate. During ion implantation, ions are accelerated at a sufficiently high voltage to penetrate the substrate surface to a desired depth. Increasing the accelerating voltage increases the depth of the concentration peak of the impurities.

Regions of the substrate at which implantation is not desired are protected with photoresist. However, the photoresist is modified during implantation, and is rendered more difficult to remove after implantation than a normal (non-implanted) photoresist. Particularly, implanted ions damage regions of the photoresist, thereby breaking near-surface C—H bonds and forming carbon-carbon single and double bonds. The resulting tough, carbon-rich or "carbonized" layer (or "skin" or "crust") of cross-linked, implanted photoresist encapsulates the distinct underlying bulk photoresist. The thickness of the carbon-rich layer is a function of the implant species, voltage, dose and current. The carbon-rich layer typically has a thickness of from about 200 Å to about 2000 Å. See, A. Kirkpatrick et al., "Eliminating heavily implanted resist in sub-0.25-µm devices," MICRO, 71 (July/August 1998). According to E. Pavel, as implant doses and energies increase, implanted photoresist can become increasingly more difficult to remove.

Carbon-rich layers can also be formed in organic photoresist during plasma processing techniques, other than ion-implantation techniques, in which ion bombardment of the photoresist also occurs.

Oxygen plasma ashing techniques can remove the carbon-rich layer, but only at a slow rate of about 500 Å/min or less. The etching mechanism of these techniques is the radical reaction of oxygen atoms with hydrocarbons in the photoresist to produce $H_2O$ and $CO_2$.

It has been determined that an external bias can be applied to the substrate to enhance the removal rate of the cross-linked layer. The applied bias provides energy to the carbon-rich layer, which breaks carbon single bonds and thereby enhances reactions with oxygen radicals.

Figure 2:
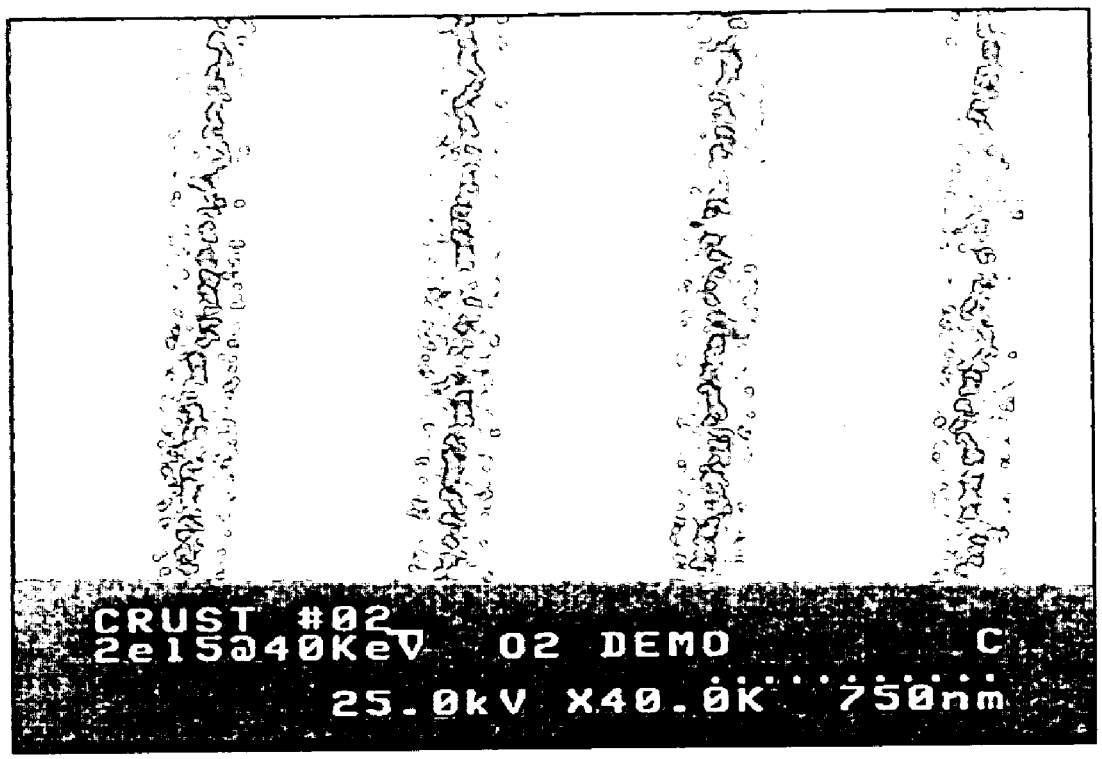
FIG. 2 is a scanning electron microscope (SEM) micrograph showing typical residue present on the surface of a post-implant substrate after etching an organic photoresist in an RF-biased plasma source using 100% $O_2$ or $H_2O$ vapor.

However, it has also been determined that applying an external bias to the substrate to enhance photoresist removal can also produce undesired effects. FIG. 1 schematically depicts a process of removing organic photoresist from an ion-implanted substrate 10. The substrate 10 includes silicon 11 that is ion implanted and a thin overlying inorganic layer 12 (e.g., a silicon-containing layer, such as $SiO_x$). A photoresist 16 applied over the inorganic layer 12 includes bulk photoresist 18, and an overlying carbon-rich layer 20 formed by the ion-implantation process. The photoresist 16 spacing is typically about 0.25 µm or less on the substrate 10. In a biased system, energetic $O_2^+$ ions can cause sputtering of the inorganic layer 12. Sputtering of the inorganic layer 12 is undesirable because for typical process specifications the maximum amount of inorganic material (e.g., oxide) loss during the removal of the carbon-rich layer 20 and the bulk photoresist 18 is less than about 2 Å. The carbon-rich layer 20 can typically have a thickness of from about 200 to about 2000 Å, and the bulk photoresist 18 can typically have a thickness of about several thousand angstroms. In addition, sputtered inorganic material can re-deposit on the substrate and on the photoresist, resulting in organic and inorganic residue being present on the substrate after cleaning. FIG. 2 is a scanning electron microscope (SEM) micrograph showing residue present on the surface of a post-implant wafer at regions at which photoresist is present on the substrate after photoresist ashing in an RF-biased plasma source using 100% $O_2$ or $H_2O$ vapor.

Another undesirable effect of applying a bias voltage to the substrate for carbon-rich layer removal is that oxygen ions of the plasma may have sufficiently high energy to penetrate the thin inorganic layer and oxidize the underlying silicon.

In light of the above-described findings, it has been determined that process gases including $C_xH_yF_z$ (where y≧x and z≧0) can be used in organic photoresist etching processes to control, and preferably to eliminate, sputtering and re-deposition, as well as growth, of inorganic material. The inorganic material can be, for example, a silicon-containing material (e.g., Si, $SiO_x$ [e.g. $SiO_2$], $Si_xN_y$ [e.g., $Si_3N_4$], $Si_xO_yN_z$, and the like), and HfO. The photoresist can be present on various substrate materials including, e.g., silicon, $SiO_2$, $Si_3N_4$, and the like.

More particularly, preferred process gases for removing the carbon-rich overlying bulk photoresist include $C_xH_yF_z$ gases (where y≧x and z≧0), e.g., $CH_2F_2$ and $CH_3F$, preferably $CH_3F$, and at least one of an oxygen-containing gas and a hydrogen-containing gas that is different from the $C_xH_yF_z$. The process gas can also include one or more other optional gases, such as $N_2$. Also, the process gas can include one or more inert carrier gases, such as Ar, He, or the like.

The oxygen-containing gas is preferably $O_2$, $H_2O$ vapor, or a mixture thereof. The hydrogen-containing gas can be $H_2$, or the like. The gas mixture preferably comprises, by volume, from about 5% to about 30% of $C_xH_yF_z$ (where y≧x and z≧0), and from about 95% to about 70% of at least one of the oxygen-containing gas and the hydrogen-containing gas, and any optional gas. More preferably, the gas mixture comprises at least about 10% $C_xH_yF_z$ (where y≧x and z≧0), with the balance being an oxygen-containing gas, a hydrogen-containing gas or a mixture thereof, and optional gas.

It also has been determined that increasing the volume percentage of $C_xH_yF_z$ in the gas mixture to above a certain volume percentage can result in deposition of a carbon-containing film onto the inorganic layer, rather than in net removal of the inorganic layer (i.e., a decreased thickness of the inorganic layer). However, the volume percentage of $C_xH_yF_z$ in the gas mixture preferably is sufficiently low to avoid incorporating fluorine into the underlying substrate.

It also has been determined that when $H_2$ is used as the hydrogen-containing gas, the carbon-rich layer is softened, making this layer easier to remove by etching.

It has also been determined that process gases including $CH_3F$ can be used to remove the carbon-rich layer at a suitably high etch rate and with a suitably high etch rate selectivity relative to the inorganic layer. For example, process gas mixtures containing $CH_3F$ and $O_2$ can be used to remove a carbon-rich layer having a thickness of 2000 Å in about 30 seconds or less (i.e., at an etch rate of at least about 4000 Å/min), preferably in about 20 seconds or less (i.e., at an etch rate of at least about 6000 Å/min). During the removal of a carbon-rich layer having a thickness of about 200 to about 2000 Å, it is preferable that the plasma remove less than about 5 Å, more preferably less than about 2 Å, of the exposed inorganic layer.

Other gases that can remove the carbon-rich layer include $CF_4$ and $CHF_3$. However, these gases are not selective with respect to the inorganic layer (e.g., to an $SiO_x$ layer). Accordingly, these gases are not preferred for use in photoresist removal processes for which selectivity to the inorganic layer is desired, as these gases may remove more than an acceptable amount of the inorganic layer during removal of the carbon-rich layer.

The photoresist can be any suitable organic polymer composition. For example, the photoresist composition can include a resin of the Novolak class, a polystyrene component, or the like.

To remove the organic photoresist, the process gas including $C_xH_yF_z$ (where y≧x and z≧0), and preferably also at least one of an oxygen-containing gas and a hydrogen-containing gas different from the $C_zH_yF_z$, is energized to generate a plasma.

The plasma is preferably generated from the process gas by applying radio frequency (RF) to an electrically conductive coil outside of the plasma processing chamber. The wafer is preferably placed in the plasma generation region.

Figure 3:
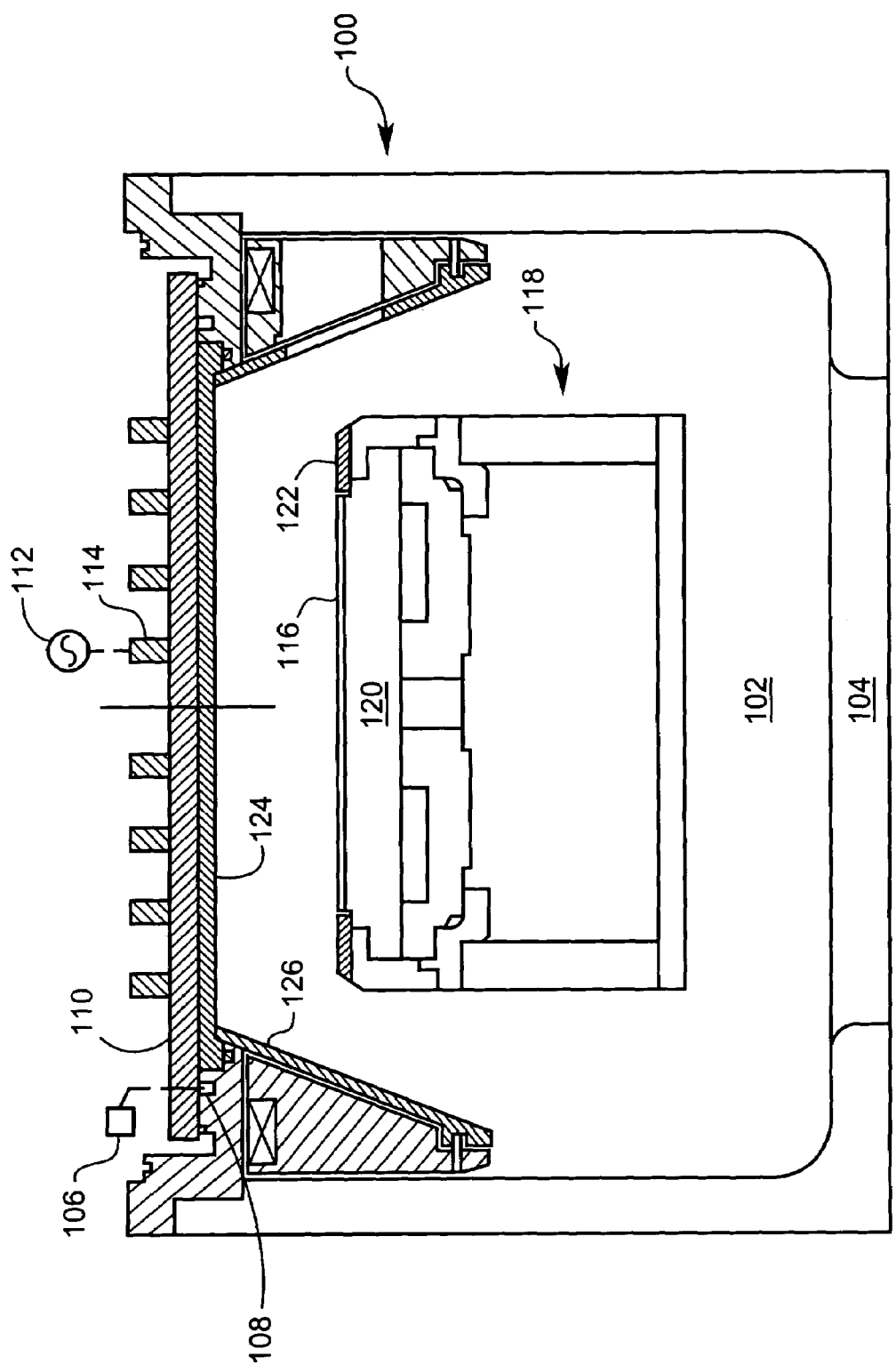
FIG. 3 depicts an exemplary inductively-coupled plasma reactor which can be used to perform embodiments of the methods of removing photoresist from substrates.

The plasma reactor is preferably an inductively coupled plasma reactor. Embodiments of the methods of removing photoresist from substrates can be performed in an inductively-coupled plasma reactor, such as the reactor 100 shown in FIG. 3. The reactor 100 includes an interior 102 maintained at a desired vacuum pressure by a vacuum pump connected to an outlet 104. Process gas can be supplied to a showerhead arrangement by supplying gas from a gas supply 106 to a plenum 108 extending around the underside of a dielectric window 110. A high density plasma can be generated in the interior 102 by supplying RF energy from an RF source 112 to an external RF antenna 114, such as a planar spiral coil having one or more turns disposed outside the dielectric window 110 on top of the reactor 100.

A substrate 116, such as a semiconductor wafer, is supported within the interior 102 of the reactor 100 on a substrate support 118. The substrate support 118 can include a chucking apparatus, such as an electrostatic chuck 120, and the substrate 116 can be surrounded by a dielectric focus ring 122. The chuck 120 can include an RF biasing electrode for applying an RF bias to the substrate during plasma processing of the substrate 116. The process gas supplied by the gas supply 106 can flow through channels between the dielectric window 110 and an underlying gas distribution plate 124 and enter the interior 102 through gas outlets in the plate 124. The reactor can also include a liner 126 extending from the plate 124.

An exemplary plasma reactor that can be used for generating plasma is the 2300 TCP reactor from Lam Research Corporation. Typical operation conditions for the plasma reactor are as follows: from about 500 to about 1000 watts inductive power applied to upper electrode (coil), reaction chamber pressure of from about 15 to about 60 mTorr, and a total process gas flow rate of from about 200 to about 600 sccm.

Figure 4:
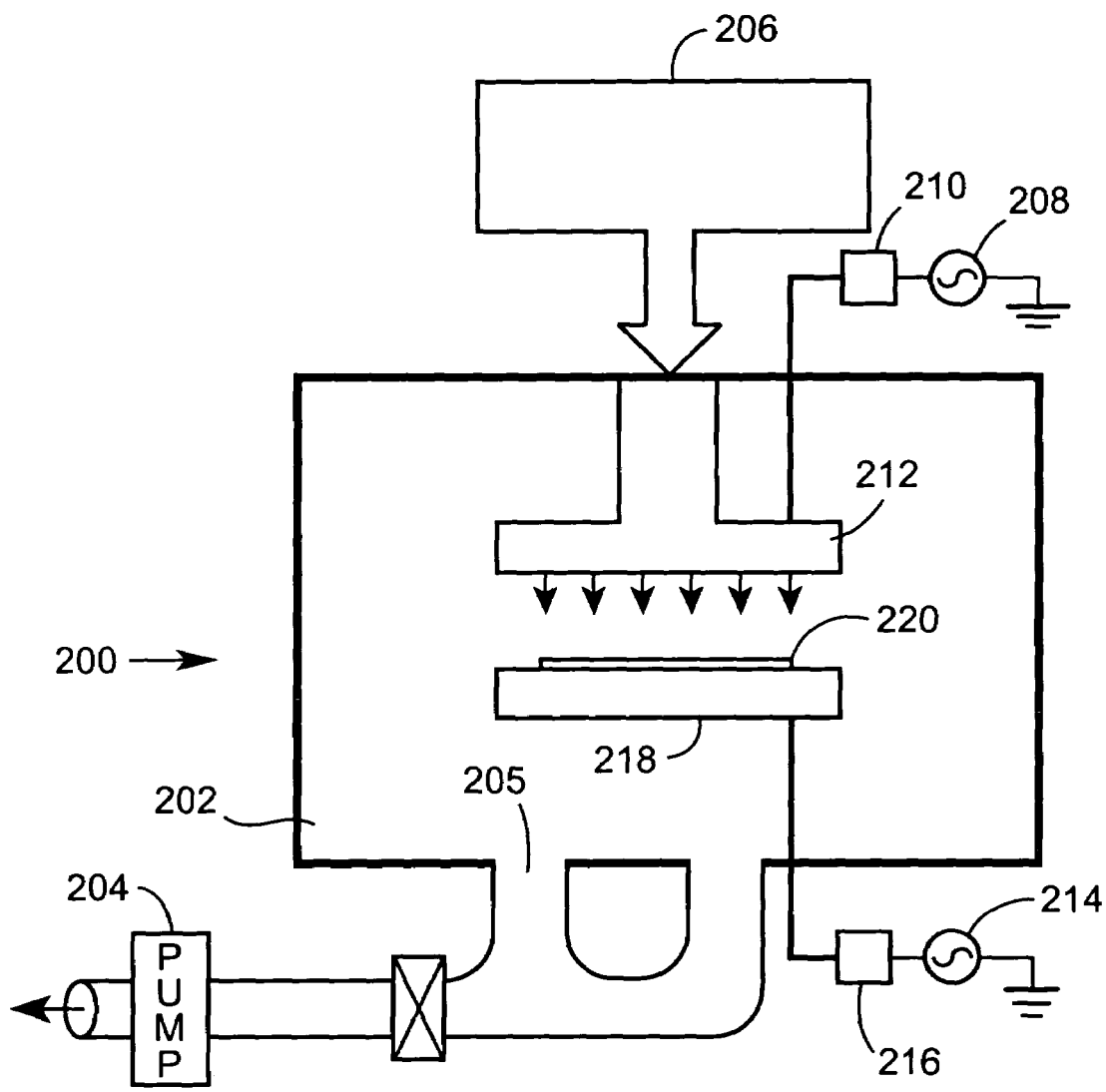
FIG. 4 depicts an exemplary parallel-plate plasma reactor which can be used to perform embodiments of the methods of removing photoresist from substrates.

Embodiments of the methods of removing photoresist from substrates can also be performed in a parallel-plate plasma reactor, such as reactor 200 shown in FIG. 4. The reactor 200 includes an interior 202 maintained at a desired vacuum pressure by a vacuum pump 204 connected to an outlet 205 in a wall of the reactor. Process gas can be supplied to a showerhead electrode 212 by supplying gas from a gas supply 206. A medium-density plasma can be generated in the interior 202 by supplying RF energy from RF source 208, 210 and RF source 214, 216 to the showerhead electrode 212, and to a bottom electrode of a chuck 220 of a substrate support 218. Alternatively, the showerhead electrode 212 can be electrically grounded, and RF energy at two different frequencies can be supplied to the bottom electrode. Other capacitively-coupled etch reactors can also be used, such as those having RF power supplied only to a showerhead or upper electrode, or only to a bottom electrode.

During removal of the carbon-rich layer, the substrate is preferably maintained at a sufficiently low temperature on a substrate support to prevent rupturing of the layer. For example, a carbon-rich layer may rupture when solvents in the photoresist composition are volatilized by heating, producing particles that may deposit on the substrate. To avoid such rupturing of the carbon-rich layer, the substrate is preferably maintained at a temperature of less than about 150° C., and more preferably from about 20 to about 75° C., and a chamber pressure of less than about 500 mTorr during etching of the carbon-rich layer.

During etching of the carbon-rich layer, RF bias is preferably applied to the substrate with a bias electrode provided in the substrate support on which the substrate is supported. The RF bias is preferably capacitive. The applied RF bias and the generation of the plasma preferably are independently controllable to independently control ion energy and ion flux, respectively. The RF bias accelerates ions in the plasma and adds energy to the substrate, which increases the removal rate of the carbon-rich layer. The RF bias voltage applied to the substrate is preferably less than about 100 volts (with respect to ground), more preferably less than about 20 volts. It has been unexpectedly determined that the combined use of fluorine in the process gas and an applied RF bias to the substrate is effective to remove the carbon-rich layer at a sufficiently high rate while also providing high selectivity to inorganic material (e.g., oxide) present on the substrate. It has further been determined that at a given volume percentage of $C_xH_yF_z$ included in the process gas, the RF bias can be maintained at a low level that reduces the inorganic material removal rate from the substrate during etching of the carbon-rich layer.

Figure 5:
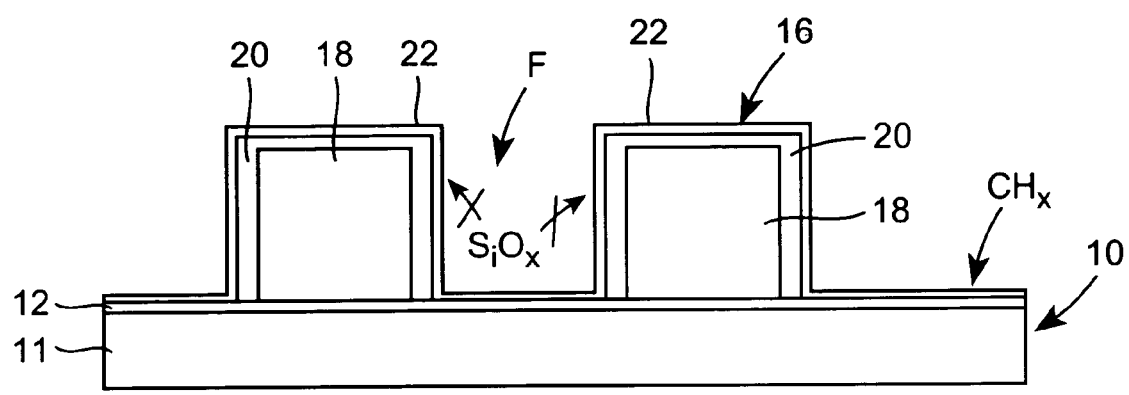
FIG. 5 schematically illustrates a process for removing an ion-implanted, carbon-rich layer formed on organic photoresist overlying a silicon substrate using a plasma generated from a process gas containing $CH_3F$ and $O_2$ or $H_2O$ vapor with RF bias applied to the substrate.

Referring to FIG. 5, it has been determined that the addition of fluorine, preferably in a small amount, to a process gas including an oxygen-containing gas, preferably $O_2$, $H_2O$ vapor or a mixture thereof, can reduce sputtering of the inorganic layer 12 (e.g., an oxide layer) and the re-deposition of sputtered inorganic material, if present, on the substrate. Fluorine can also contribute to the removal of inorganic materials that may be in or on the post-ion implant photoresist.

The addition of hydrogen to the process gas used to etch the carbon-rich layer increases the etch rate by reacting with cross-linked carbon. It is believed that fluorine may also enhance the carbon-rich layer etch rate.

The addition of $CH_x$ species to the process gas used to etch the carbon-rich layer causes a passivating layer 22 to form on the oxide layer 12 and the photoresist 16 (see FIG. 5), which reduces the amount of ion-induced oxide growth and oxide sputtering.

The complete removal of the carbon-rich layer 20 can be detected during the etching process by using an endpoint detection technique, which can determine the time at which the underlying bulk photoresist is exposed. The endpoint for carbon-rich layer removal is preferably determined by an optical emission technique. For example, the optical emission technique can monitor the emission from carbon monoxide (CO) at a wavelength of about 520 nm. During the removal of the carbon-rich layer, a small CO signal is produced due to the low etch rate. Once the carbon-rich layer is opened, the exposed underlying bulk photoresist is etched at a faster rate than the carbon-rich layer and, consequently, the CO concentration and the corresponding CO signal increase.

After removal of the carbon-rich layer, the underlying bulk photoresist is preferably removed using a different photoresist etch process. For example, the bulk photoresist can be removed by oxygen ashing at a higher temperature than the temperature preferably used during the carbon-rich layer etching step. For example, the substrate temperature can range from about 200° C. to about 280° C. during the bulk photoresist etching step. The chamber pressure is preferably greater than about 500 mTorr during bulk photoresist removal. Oxygen ashing also can achieve a high removal rate of the bulk photoresist. For example, an $O_2/N_2$ plasma can remove the bulk photoresist at a rate of from about 4 to about 6 microns/min. An optional over-ash step can also be used. Volatile solvents in the photoresist can be exhausted from the plasma processing chamber as the photoresist is ashed.

The bulk photoresist is preferably removed using a plasma generated upstream from the substrate. The bulk photoresist removal step can be performed in the same processing chamber that is used to etch the carbon-rich layer. Alternatively, the bulk photoresist can be removed by etching in a different processing chamber. That is, the substrate can be removed from the processing chamber after etching the carbon-rich layer, and placed in a different processing chamber to etch the bulk photoresist. Using different processing chambers can obviate changing gas chemistries and/or the substrate temperature during removal of the carbon-rich layer and ashing.

Exemplary process conditions for removing the carbon-rich layer are as follows: chamber pressure of about 90 mTorr, about 1000 Watts of power applied to upper electrode (coil), about 5 Watts of power applied to bias electrode, total process gas flow rate of about 400 sccm, and substrate temperature of about 75° C. Exemplary process conditions for removing bulk photoresist are as follows: chamber pressure of about 1000 mTorr, about 2500 Watts of power applied to the plasma source, total process gas flow rate of about 4400 sccm, and substrate temperature of about 220° C.

Figure 6:
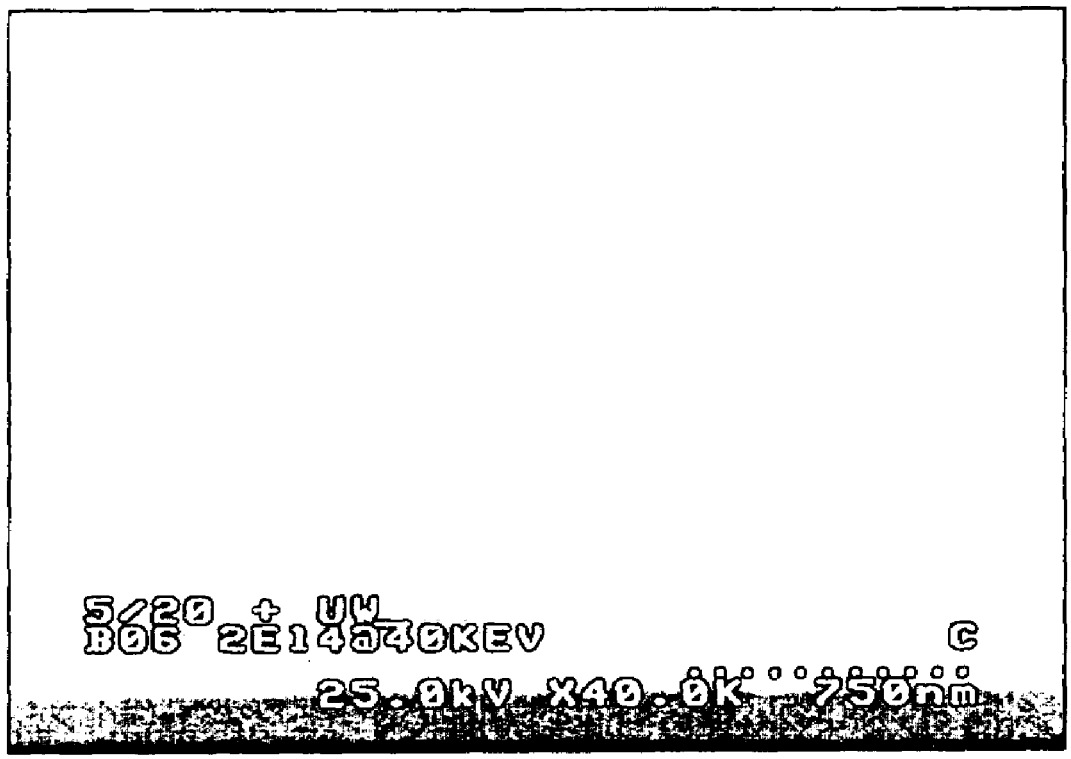
FIG. 6 is an SEM micrograph showing the surface of a post-implant wafer after photoresist removal in an RF-biased plasma source using a process gas containing $CH_3F$ and $O_2$.

FIG. 6 shows an SEM micrograph taken of a substrate surface after performing a photoresist removal process according to a preferred embodiment. The substrate was ion implanted with arsenic at a dose of about $2 \times 10^{15}$ atoms/cm$^2$, and at an implantation energy of 40 keV. The etching process included removing the carbon-rich layer formed on the bulk photoresist using an $O_2$/$CH_3F$ process gas with RF bias applied to the substrate, and then removing the underlying bulk photoresist using an $O_2$/$N_2$ process gas. As shown in FIG. 6, the photoresist was completely removed and no post-etch residue is present on the wafer. The carbon-rich layer removal endpoint time with the addition of $CH_3F$ also was significantly reduced. While not wishing to be bound to any particular theory, this result is believed to be due to H (and also possibly F) included in the process gas enhancing the etch rate of the carbon-rich layer.

EXAMPLES

Silicon wafers were ion implanted with arsenic at a dose of about $2 \times 10^{15}$ atoms/cm$^2$ and at an implantation energy of 40 keV to produce a carbon-rich layer on underlying bulk photoresist. The Table below shows the etch rates that were determined for silicon oxide, bulk photoresist, and the carbon-rich layer at different additions of $CH_3F$ (on a volume percent basis) to an $O_2$-containing process gas, which was used to generate plasma to remove the carbon-rich layer. During stripping of the carbon-rich layer, an RF bias at a power level of 5 watts was applied to the substrate.

The bulk photoresist etch rate was estimated by placing a non-implanted organic photoresist having a known thickness in a processing chamber and partially stripping the photoresist. As bulk photoresist is also non-implanted material, the calculated bulk photoresist etch rate approximates the etch rate of bulk photoresist underlying an implanted carbon-rich layer. The carbon-rich layer thickness was measured using an SEM prior to stripping. The carbon-rich layer etch rate was calculated by measuring the endpoint time of the etch, and determining the thickness reduction of the carbon-rich layer.

TABLE

| % CH$_3$F (vol. %) | Oxide Etch Rate (Å/min) | Bulk Photoresist Etch Rate (Å/min) | Carbon-rich Layer Etch Rate (Å/min) |
| --- | --- | --- | --- |
| 0.0 | 1 | 4174 | 1300 |
| 2.5 | 5 | 4742 | |
| 10.0 | 3 | 5642 | 2400 |
| 15.0 | −1 | 5004 | |
| 30 | −8 | >6000 | |

The test results show that the oxide etch rate increases with a small addition of $CH_3F$, but decreases with increased additions of $CH_3F$. The oxide removal rate is reduced by adding more than 2.5% by volume of $CH_3F$ to the process gas. The bulk photoresist etch rate is increased by increasing the volume percent of $CH_3F$. The carbon-rich layer etch rate is also enhanced by the addition of $CH_3F$.

The test results demonstrate the existence of a process regime within which $CH_3F$ passivates and protects the $SiO_x$ surface from chemical and/or physical attack. The oxide etch rate increases with the addition of $CH_3F$ up to a $CH_3F$ percentage at which passivation of the inorganic layer is sufficiently large to stop the etching of the inorganic layer. While not wishing to be bound to any particular theory, the enhanced photoresist etch rate is believed to be due to the presence of both H and F radicals in the plasma.

For comparison, gas mixtures containing 10% $CF_4$ (balance $O_2$), and 10% $CHF_3$ (balance $O_2$), were used to generate a plasma and remove the carbon-rich layer on bulk photoresist from ion-implanted silicon wafers. The oxide etch rate for the gas mixture containing $CF_4$ was 27 Å/min, and the oxide etch rate for the gas mixture containing $CHF_3$ was 15 Å/min. These oxide etch rates are too high for photoresist removal processes that have stringent maximum oxide removal specifications, such as those having a maximum oxide etch rate of about 5 Å/min, and especially those having a maximum oxide etch rate of less than about 2 Å/min.

While the invention has been described in detail with reference to specific embodiments thereof, it will be apparent to those skilled in the art that various changes and modifications can be made, and equivalents employed, without departing from the scope of the appended claims.

What is claimed is:

1. A method of etching an organic photoresist on a substrate, comprising:
   positioning a substrate in a plasma processing chamber of a plasma reactor, the substrate including an inorganic layer and an organic photoresist overlying the inorganic layer, the photoresist including a carbon-rich layer overlying bulk photoresist;
   supplying a process gas to the plasma processing chamber, the process gas comprising $CH_3F$ and an oxygen-containing gas, wherein the process gas does not contain a hydrogen-containing gas different from the $CH_3F$;
   generating a plasma from the process gas; and
   selectively etching the carbon-rich layer relative to the inorganic layer.

2. The method of claim 1, wherein the process gas comprises, by volume, (i) from about 5% to about 30% of the $CH_3F$, and (ii) from about 95% to about 70% of the oxygen-containing gas.

3. The method of claim 1, wherein:
   the etch rate of the carbon-rich layer is from about 4000 Å/mm to about 6000 Å/mm; and
   during etching of the carbon-rich layer, the thickness of the inorganic layer is reduced by less than about 5 Å, or by less than about 2 Å.

4. The method of claim 1, wherein the oxygen-containing gas is $O_2$ or $H_2O$ vapor.

5. The method of claim 1, further comprising applying an external RE bias to the substrate during etching of the carbon-rich layer, wherein the applied RF bias and the generation of plasma are independently controlled to independently control ion energy and ion flux.

6. The method of claim 1, further comprising maintaining the substrate at a temperature of less than about 150° C., or from about 20° C. to about 75° C., during etching of the carbon-rich layer.

7. The method of claim 1, further comprising detecting an endpoint of the removal of the carbon-rich layer using optical emission.

8. The method of claim 1, wherein the carbon-rich layer is an ion-implanted layer.

9. The method of claim 1, wherein the inorganic layer is a silicon-containing layer.

10. The method of claim 1, further comprising:
after etching the carbon-rich layer, removing the substrate from the plasma processing chamber and placing the substrate in an ashing chamber;
supplying an ashing gas containing oxygen to the ashing chamber;
generating a plasma from the ashing gas; and
etching the bulk photoresist.

11. The method of claim 10, wherein the ashing gas comprises $O_2$ or $H_2O$ vapor, and the substrate is maintained at a temperature of from about 200° C. to about 280° C. during etching of the bulk photoresist.

12. The method of claim 1, wherein:
the plasma reactor is an inductively-coupled plasma reactor;
a planar antenna inductively couples RE energy into the plasma processing chamber through a dielectric member; and
the substrate is positioned in the plasma processing chamber facing the dielectric member.

13. The method of claim 1, wherein the process gas comprises (i) from about 10% to about 30% of the $CH_3F$ and (ii) from about 90% to about 70% of the oxygen-containing gas.

14. The method of claim 13, wherein the oxygen-containing gas is $O_2$.

15. The method of claim 1, wherein the inorganic layer is a silicon-containing layer which is etched at an etch rate of less than about 5 Å/mm.

16. The method of claim 15, wherein the inorganic layer is a silicon-containing layer which is etched at an etch rate of less than about 2 Å/mm.

17. A method of etching an organic photoresist on a substrate, comprising:
positioning a substrate in a plasma processing chamber of a plasma reactor, the substrate including an inorganic layer and an organic photoresist overlying the inorganic layer, the photoresist including a carbon-rich layer overlying bulk photoresist;
supplying to the plasma processing chamber a process gas comprising $CH_3F$, and at least one of (i) an oxygen-containing gas, and (ii) a hydrogen-containing gas different from the $CH_3F$;
generating a plasma from the process gas; and
selectively etching the carbon-rich layer relative to the inorganic layer while applying an external RE bias to the substrate.

18. The method of claim 17, wherein the process gas comprises, by volume, (i) from about 95% to about 70% of the oxygen-containing gas, and (ii) from about 5% to about 30% of the $CH_3F$.

19. The method of claim 17, wherein:
the etch rate of the carbon-rich layer is from about 4000 Å/mm to about 6000 Å/mm; and
during etching of the carbon-rich layer, the thickness of the inorganic layer is reduced by less than about 5 Å, or by less than about 2 Å.

20. The method of claim 17, wherein the oxygen-containing gas is $O_2$ or $H_2O$ vapor, and the hydrogen-containing gas is $H_2$.

21. The method of claim 17, further comprising maintaining the substrate at a temperature of less than about 150° C., or from about 20° C. to about 75° C., during etching of the carbon-rich layer.

22. The method of claim 17, further comprising detecting an endpoint of the removal of the carbon-rich layer using optical emission.

23. The method of claim 17, wherein the carbon-rich layer is an ion-implanted layer.

24. The method of claim 17, wherein the inorganic layer is a silicon-containing layer which is etched at an etch rate of less than about 5 Å/mm.

25. The method of claim 17, wherein:
the plasma reactor is an inductively-coupled plasma reactor;
a planar antenna inductively couples RF energy into the plasma processing chamber through a dielectric member; and
the substrate is positioned in the plasma processing chamber facing the dielectric member.

26. The method of claim 17, wherein the process gas does not contain the hydrogen-containing gas different from the $CH_3F$.

27. A method of etching an organic photoresist on a substrate, comprising:
positioning a substrate in a plasma processing chamber of a plasma reactor, the substrate including an inorganic layer and an organic photoresist overlying the inorganic layer, the photoresist including a carbon-rich layer overlying bulk photoresist;
supplying to the plasma processing chamber a process gas comprising $CH_3F$, and at least one of (i) an oxygen-containing gas, and (ii) a hydrogen-containing gas different from the $CH_3F$;
generating a plasma from the process gas;
selectively etching the carbon-rich layer relative to the inorganic layer while applying an external RF bias to the substrate;
after etching the carbon-rich layer, optionally removing the substrate from the plasma processing chamber and placing the substrate in an ashing chamber;
supplying an ashing gas containing oxygen to (i) the plasma processing chamber or (ii) the ashing chamber, in which the substrate is positioned;
generating a plasma from the ashing gas; and
etching the bulk photoresist.

28. The method of claim 27, wherein the carbon-rich layer and the bulk photoresist are etched in the plasma processing chamber.

29. The method of claim 27, wherein the carbon-rich layer is etched in the plasma processing chamber, and the bulk photoresist is etched in the ashing chamber.

30. The method of claim 27, wherein the ashing gas comprises $O_2$ or $H_2O$ vapor, and the substrate is maintained at a temperature of from about 200° C. to about 280° C. during etching of the bulk photoresist.

31. The method of claim 27, wherein the process gas does not contain the hydrogen-containing gas different from the $CH_3F$.

32. A method of etching an organic photoresist on a substrate, comprising:
positioning a substrate in a plasma processing chamber of a plasma reactor, the substrate including a silicon-containing layer and an organic photoresist overlying the silicon-containing layer, the photoresist including a carbon-rich layer overlying bulk photoresist;

supplying a process gas comprising $CH_3F$ and an oxygen-containing gas to the plasma processing chamber;
generating a plasma from the process gas; and
selectively etching the carbon-rich layer relative to the silicon-containing layer while applying an external RE bias to the substrate.

33. The method of claim 32, wherein (i) the etch rate of the carbon-rich layer is from about 4000 Å/mm to about 6000 Å/mm, and (ii) during etching of the carbon-rich layer, the thickness of the inorganic layer is reduced by less than about 5 Å, or by less than about 2 Å.

34. The method of claim 32, wherein the carbon-rich layer is an ion-implanted layer.

35. The method of claim 32, wherein the process gas does not contain a hydrogen-containing gas different from the $CH_3F$.

* * * * *

UNITED STATES PATENT AND TRADEMARK OFFICE
CERTIFICATE OF CORRECTION

PATENT NO. : 7,083,903 B2
APPLICATION NO. : 10/462830
DATED : August 1, 2006
INVENTOR(S) : Erik A. Edelberg et al.

It is certified that error appears in the above-identified patent and that said Letters Patent is hereby corrected as shown below:

Column 8, Claim 3, line 52 of the claim, "Å/mm" should read --Å/min-- (both occurrences);

Column 8, Claim 5, line 60 of the claim, "RE" should read --RF--;

Column 9, Claim 12, line 23 of the claim, "RE" should read --RF--;

Column 9, Claim 15, line 36 of the claim, "Å/mm" should read --Å/min--;

Column 9, Claim 16, line 39 of the claim, "Å/mm" should read --Å/min--;

Column 9, Claim 17, line 53 of the claim, "RE" should read --RF--;

Column 9, Claim 19, line 61 of the claim, "Å/mm" should read --Å/min-- (both occurrences);

Column 10, Claim 24, line 3 of the claim, "Å/mm" should read --Å/min--;

Column 11, Claim 32, line 5 of the claim, "RE" should read --RF--; and

Column 11, Claim 33, line 8 of the claim, "Å/mm" should read --Å/min-- and line 9 of the claim, "Å/mm" should read --Å/min--.

Signed and Sealed this

Eleventh Day of September, 2007

JON W. DUDAS
*Director of the United States Patent and Trademark Office*